(12) United States Patent
Cho et al.

(10) Patent No.: US 10,315,950 B2
(45) Date of Patent: Jun. 11, 2019

(54) COMPOSITION FOR FORMING SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: Jae Hwi Cho, Suwon-si (KR); Dong Suk Kim, Suwon-si (KR); Seok Hyun Jung, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/610,999

(22) Filed: Jun. 1, 2017

(65) Prior Publication Data

US 2017/0362117 A1 Dec. 21, 2017

(30) Foreign Application Priority Data

Jun. 15, 2016 (KR) ........................ 10-2016-0074780

(51) Int. Cl.
| | | |
|---|---|---|
| *C03C 8/18* | (2006.01) | |
| *H01B 1/20* | (2006.01) | |
| *C03C 8/04* | (2006.01) | |
| *C03C 3/14* | (2006.01) | |
| *H01L 31/0224* | (2006.01) | |
| *C03C 4/14* | (2006.01) | |
| *H01B 1/14* | (2006.01) | |

(52) U.S. Cl.
CPC ............. *C03C 8/18* (2013.01); *C03C 3/142* (2013.01); *C03C 4/14* (2013.01); *C03C 8/04* (2013.01); *H01B 1/14* (2013.01); *H01B 1/20* (2013.01); *H01L 31/022425* (2013.01); *C03C 2204/00* (2013.01); *C03C 2205/00* (2013.01)

(58) Field of Classification Search
None
See application file for complete search history.

(56) References Cited

U.S. PATENT DOCUMENTS

| | | | |
|---|---|---|---|
| 2012/0104332 A1 | 5/2012 | Kim et al. | |
| 2014/0131629 A1* | 5/2014 | Choi | H01B 1/22 252/514 |
| 2015/0243812 A1* | 8/2015 | Hardin | C09D 5/24 136/256 |

(Continued)

FOREIGN PATENT DOCUMENTS

| | | |
|---|---|---|
| CN | 104733074 A | 6/2015 |
| CN | 104798209 A | 7/2015 |
| CN | 105097067 A | 11/2015 |

(Continued)

OTHER PUBLICATIONS

Chinese Office Action dated Sep. 5, 2018.
(Continued)

*Primary Examiner* — Katie L. Hammer
(74) *Attorney, Agent, or Firm* — Lee & Morse, P.C.

(57) ABSTRACT

A composition for solar cell electrodes including a conductive powder, a glass frit, and an organic vehicle. The glass frit contains tellurium (Te), sodium (Na), zinc (Zn), and at least one of lead (Pb) and bismuth (Bi). A molar ratio of the sum of lead and bismuth to zinc ranges from about 1 to about 20. A molar ratio of tellurium to sodium ranges from about 1 to about 15.

14 Claims, 1 Drawing Sheet

(56) References Cited

U.S. PATENT DOCUMENTS

2016/0190362 A1* 6/2016 Neidert ............ H01L 31/02242
136/244

FOREIGN PATENT DOCUMENTS

| | | | | |
|---|---|---|---|---|
| EP | 2903034 A1 * | 8/2015 | ............... | H01B 1/22 |
| JP | 2012-84585 A | 4/2012 | | |
| KR | 2015-0132804 A | 11/2015 | | |
| KR | 2016-0057583 A | 5/2016 | | |
| TW | 201616514 A | 5/2016 | | |
| TW | 201631604 A | 9/2016 | | |

OTHER PUBLICATIONS

Taiwanese Office Action dated May 22, 2018. (with English Summary).
Chinese Office Action dated Feb. 12, 2019.

* cited by examiner

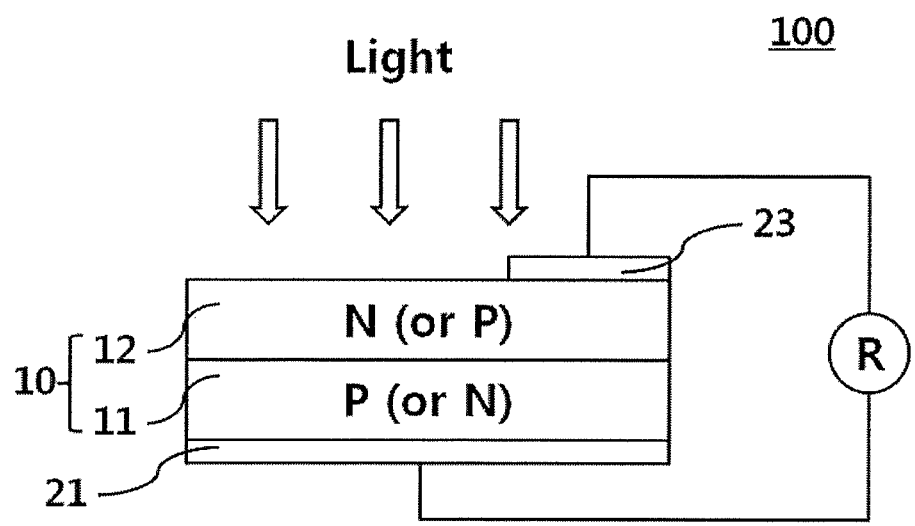

COMPOSITION FOR FORMING SOLAR CELL ELECTRODE AND ELECTRODE PREPARED USING THE SAME

CROSS-REFERENCE TO RELATED APPLICATION

Korean Patent Application No. 10-2016-0074780, filed on Jun. 15, 2016, in the Korean Intellectual Property Office, and entitled: "Composition for Forming Solar Cell Electrode and Electrode Prepared Using the Same," is incorporated by reference herein in its entirety.

BACKGROUND

1. Field

Embodiments relate to a composition for a solar cell electrode and a solar cell electrode fabricated using the same.

2. Description of Related Art

Solar cells generate electricity using the photovoltaic effect of a p-n junction, which converts photons of sunlight into electricity. In the solar cell, front and rear electrodes are located at upper and lower surfaces of a semiconductor wafer or substrate with the p-n junctions, respectively. The photovoltaic effect at the p-n junction is induced by sunlight entering the semiconductor wafer. Electrons generated by the photovoltaic effect at the p-n junction provide electric current to the outside through the electrodes. The electrodes of the solar cell may be formed on the wafer by applying, an electrode composition and patterning and baking the applied electrode composition.

SUMMARY

Embodiments are directed to a composition for solar cell electrodes including a conductive powder, a glass frit, and an organic vehicle. The glass frit contains tellurium (Te), sodium (Na), zinc (Zn), and at least one of lead (Pb) and bismuth (Bi). A molar ratio of the sum of lead and bismuth to zinc ranges from about 1 to about 20. A molar ratio of tellurium to sodium ranges from about 1 to about 15.

The molar ratio of the sum of lead and bismuth to zinc may range from about 1 to about 15.

The molar ratio of tellurium to sodium may range from about 1 to about 10.

The glass fit may include about 5 mol % to about 50 mol % of the at least one of lead and bismuth, about 10 mol % to about 45 mol % of tellurium, about 1 mol % to about 20 mol % of sodium, and about 1 mol % to about 15 mol % of zinc.

The glass frit may further include at least one of aluminum, calcium, boron, copper, iron, potassium, magnesium, and silicon.

The composition for solar cell electrodes may include about 60 wt % to about 95 wt % of the conductive powder, about 0.1 wt % to about 20 wt % of the glass fit, and about 1 wt % to about 30 wt % of the organic vehicle.

The composition for solar cell electrodes may further include at least one additive selected from a dispersant, a thixotropic agent, a plasticizer, a viscosity stabilizer, an anti-foaming agent, a pigment, a UV stabilizer, an antioxidants, and a coupling agents.

A solar cell electrode may be fabricated using the composition for solar cell electrodes as describe above.

BRIEF DESCRIPTION OF DRAWING

Features will become apparent to those of skill in the art by describing in detail exemplary embodiments with reference to the attached drawings in which:

FIG. 1 illustrates a schematic view of a solar cell according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present.

Herein, the content (mol %) of each elemental metal included in a glass frit may be measured by Inductively Coupled Plasma-Optical Emission Spectrometry (ICP-OES). For example, measuring the content of each elemental metal by ICP-OES may include pre-treating a sample, preparing a standard solution, and calculating the content of each elemental metal in a glass fit by measuring and converting the concentration of each elemental metal. In pre-treating a sample, a predetermined amount of the sample may be dissolved in an acid solution capable of dissolving an analysis target (for example, an elemental metal), in a sample glass frit, and then heating for carbonization. The acid solution may include a sulfuric acid ($H_2SO_4$) solution. The carbonized sample may be diluted with a solvent, such as distilled water or hydrogen peroxide ($H_2O_2$), to an appropriate extent to allow analysis of the analysis target. In view of element detection capability of an ICP-OES spectrometer, the carbonized sample may be diluted to about 10,000 times. In measurement with the ICP-OES spectrometer, the pre-treated sample may be calibrated using a standard solution, for example, an analysis target standard solution for measuring elements. By way of example, calculation of the mole content of each element in the glass fit can be accomplished by introducing the standard solution into the ICP-OES spectrometer and plotting a calibration curve with an external standard method, followed by measuring and converting the concentration (ppm) of each elemental metal in the pre-treated sample using the ICP-OES spectrometer.

Composition for Solar Cell Electrodes

A composition for solar cell electrodes according to embodiments may include: (A) a conductive powder; (B) a glass frit; and (C) an organic vehicle, wherein the glass frit contains tellurium (Te), sodium (Na), zinc (Zn), and at least one of lead (Pb) and bismuth (Bi). A molar ratio of the sum of lead and bismuth to zinc may range from about 1 to about 20. A molar ratio of tellurium to sodium may range from about 1 to about 15.

Now, each component of the composition for solar cell electrodes will be described in more detail.

(A) Conductive Powder

The conductive powder serves to impart electrical conductivity. The composition for solar cell electrodes may include a metal powder such as silver (Ag) or aluminum (Al) as the conductive powder. For example, the conductive powder may be silver powder. The conductive powder may have a nanometer or micrometer-scale particle size. For example, the conductive powder may have a particle size of dozens to several hundred nanometers, or a particle diameter of several to dozens of micrometers. In some implementations, the conductive powder may be a mixture of two or more types of silver powder having different particle sizes.

The conductive powder may have a suitable particle shape such as, for example, a spherical, flake or amorphous particle shape.

For example, the conductive powder may have an average particle diameter (D50) of about 0.1 μM to about 10 μm, or, for example, about 0.5 μm to about 5 μm. Within this range of average particle diameter, contact resistance and line resistance may be reduced. The average particle diameter may be measured using, for example, a Model 1064D (CILAS Co., Ltd.) particle size analyzer after dispersing the conductive powder in isopropyl alcohol (IPA) at about 25° C. for about 3 minutes via ultrasonication.

The conductive powder may be present in an amount of about 60 wt % to about 95 wt % based on the total weight of the composition for solar cell electrodes. Within this range, the composition may improve conversion efficiency of a solar cell and may be easily prepared in paste form. For example, the conductive powder may be present in an amount of about 70 wt % to about 90 wt % based on the total weight of the composition. For example, the conductive powder may be present in an amount of about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt % based on the total weight of the composition.

(B) Glass Frit

The glass frit may serve to form metal crystal grains in an emitter region by etching an anti-reflection layer and melting the conductive powder during a baking process of the composition for solar cell electrodes. During the baking process, the glass frit may be softened such that the baking temperature may be decreased.

In the composition for solar cell electrodes, a (Pb and/or Bi)—Te—Na—Zn—O-based glass frit containing at least one of lead (Pb) and bismuth (Bi), tellurium (Te), sodium (Na), and zinc (Zn) may be used as the glass fit.

In the glass frit, a molar ratio of the sum of lead and bismuth to zinc (([Pb]+[Bi])/[Zn]) may range from about 1 to about 20, or, for example, about 1 to about 15, or, for example, about 5 to about 15. Within this range of the molar ratio of the sum of lead and bismuth to zinc, a solar cell electrode fabricated using the composition may have improved series resistance. For example, a molar ratio of the sum of lead and bismuth to zinc may be about 1, 2, 3, 4, 5, 6, 7, 8, 9, 10, 11, 12, 13, 14, 15, 16, 17, 18, 19, or 20.

In the glass frit, a molar ratio of tellurium to sodium ([Te]/[Na]) may range from about 1 to about 15, or, for example, about 1 to about 10, or, for example, about 2 to about 8. Within this range of the molar ratio of tellurium to sodium, a solar cell electrode fabricated using the composition may have improved open-circuit voltage. For example, a molar ratio of tellurium to sodium may be about 1, 2, 3, 4, 5, 6, 7, 8, 9, 10, 11, 12, 13, 14, or 15.

The glass fit may include, for example, at least one of lead and bismuth in an amount of about 5 mol % to about 50 mol %, or, for example, about 10 mol % to about 40 mol %, tellurium in an amount of about 10 mol % to about 45 mol %, or, for example, about 15 mol % to about 40 mol %, sodium in an amount of about 1 mol % to about 20 mol %, or, for example, about 1 mol % to about 15 mol %, and zinc in an amount of about 1 mol % to about 15 mol %, or, for example, about 1 mol % to about 10 mol %. Within this range, a solar cell electrode fabricated using the composition may have an excellent fill factor and conversion efficiency.

When the glass frit includes both lead and bismuth, the total amount of lead and bismuth may range from about 5 mol % to about 50 mol %, or, for example, from about 10 mol % to about 40 mol % of the glass frit. Within this range, a solar cell electrode fabricated using the composition may have an excellent fill factor and conversion efficiency. For example, the total amount of lead and bismuth may be about 5 mol %, 6 mol %, 7 mol %, 8 mol %, 9 mol %, 10 mol %, 11 mol %, 12 mol %, 13 mol %, 14 mol %, 15 mol %, 16 mol %, 17 mol %, 18 mol %, 19 mol %, 20 mol %, 21 mol %, 22 mol %, 23 mol %, 24 mol %, 25 mol %, 26 mol %, 27 mol %, 28 mol %, 29 mol %, 30 mol %, 31 mol %, 32 mol %, 33 mol %, 34 mol %, 35 mol %, 36 mol %, 37 mol %, 38 mol %, 39 mol %, 40 mol %, 41 mol %, 42 mol %, 43 mol %, 44 mol %, 45 mol %, 46 mol %, 47 mol %, 48 mol %, 49 mol %, or 50 mol % of the glass frit.

The glass frit may further include a metal and/or a metal oxide in addition to Pb/Bi, Te, Na, and Zn. The glass frit may further include at least one selected from lithium (Li), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), potassium (K), arsenic (As), cobalt (Co), zirconium (Zr), manganese (Mn), aluminum (Al), boron (B), and oxides thereof.

For example, the glass frit may further include at least one selected from aluminum, calcium, boron, copper, iron, potassium, magnesium, and silicon.

In one embodiment, the glass frit may include about 20 mol % to about 40 mol % of boron, about 0 mol % to about 1 mol % of iron, about 0 mol % to about 2 mol % of magnesium, about 1 mol % to about 10 mol % of sodium, about 5 mol % to about 20 mol % of lead, about 1 mol % to about 5 mol % of zinc, about 10 mol % to about 45 mol % of tellurium, about 5 mol % to about 20 mol % of bismuth, and about 0 mol % to 10 mol % of silicon. When the composition for solar cell electrodes includes a glass frit having the above composition, a solar cell electrode may have excellent properties in terms of series resistance, open-circuit voltage, fill factor, and conversion efficiency.

In an implementation, the total amount of boron and tellurium in the glass fit may be about 50 mol % or more, or, for example, about 50 mol % to 70 mol %. Within this range of total amount of boron and tellurium, a solar cell electrode may have excellent properties in terms of series resistance, open-circuit voltage, fill factor, and conversion efficiency.

The glass frit may be prepared by a suitable method. For example, the glass fit may be prepared by mixing the above-described components using a ball mill or a planetary mill, melting the mixture at about 900° C. to about 1,300° C., and quenching the melted mixture to about 25° C., followed by pulverizing the obtained product using a disk mill, a planetary mill, or the like.

The glass frit may be present in the composition for solar cell electrodes in an amount of about 0.1 wt % to about 20 wt %, or, for example, about 0.5 wt % to about 10 wt %, based on the total weight of the composition for solar cell electrodes. Within this range, the glass frit may secure stability of a p-n junction under various sheet resistances, minimize resistance, and ultimately improve the efficiency of a solar cell. For example, the glass fit may be present in an amount of about 0.1 wt %, 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, based on the total weight of the composition for solar cell electrodes.

(C) Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle used in a composition for solar cell electrodes. The organic vehicle may include a binder resin, a solvent, or the like.

The binder resin may be selected from acrylate resins or cellulose resins. For example, ethyl cellulose may be used as the binder resin. In some implementations, the binder resin may be selected from ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, or the like.

The solvent may be selected from, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, and ethyl lactate. These may be used alone or as a mixture thereof.

The organic vehicle may be present in an amount of about 1 wt % to about 30 wt % based on the total weight of the composition for solar cell electrodes. Within this range, the organic vehicle may provide sufficient adhesive strength and excellent printability to the composition. For example, the organic vehicle may be present in an amount of about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, based on the total weight of the composition for solar cell electrodes.

(D) Additives

The composition for solar cell electrodes may further include general additives to enhance fluidity, process properties and stability, as desired. The additives may include dispersants, thixotropic agents, plasticizers, viscosity stabilizers, anti-foaming agents, pigments, UV stabilizers, antioxidants, coupling agents, or the like. These additives may be used alone or as mixtures thereof. The additives may be present in an amount of about 0.1 wt % to about 5 wt % based on the total weight of the composition for solar cell electrodes. The content of the additives may be changed as desired. For example, the additives may be present in an amount of about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt %, based on the total weight of the composition for solar cell electrodes.

Solar Cell Electrode and Solar Cell Including the Same

According to embodiments, an electrode may be formed of the composition for solar cell electrodes and a solar cell may include the same. FIG. 1 illustrates a solar cell in accordance with an embodiment.

Referring to FIG. 1, a solar cell according to an embodiment may include a substrate 10, a front electrode 23 formed on a front surface of the substrate 10, and a rear electrode 21 formed on a back surface of the substrate 10.

In an embodiment, the substrate 10 may be a substrate with a p-n junction formed thereon. For example, the substrate 10 may include a semiconductor substrate 11 and an emitter 12. For example, the substrate 10 may be a substrate prepared by doping one surface of a p-type semiconductor substrate 11 with an n-type dopant to form an n-type emitter 12. In some implementations, the substrate 10 may be a substrate prepared by doping one surface of an n-type semiconductor substrate 11 with a p-type dopant to form a p-type emitter 12. The semiconductor substrate 11 may be one of a p-type substrate and an n-type substrate. The p-type substrate may be a semiconductor substrate doped with a p-type dopant, and the n-type substrate may be a semiconductor substrate doped with an n-type dopant.

In the description of the substrate 10, the semiconductor substrate 11, or the like, a surface of such a substrate on which light is incident is generally referred to as a "front surface" (light receiving surface), and a surface of the substrate opposite the front surface is referred to as a "back surface."

In an embodiment, the semiconductor substrate 11 may be formed of crystalline silicon or a compound semiconductor. The crystalline silicon may be monocrystalline or polycrystalline silicon. As an example of the crystalline silicon, a silicon wafer may be used.

The p-type dopant may be a material including a group III element such as boron, aluminum, or gallium. The n-type dopant may be a material including a group V element, such as phosphorus, arsenic or antimony.

The front electrode 23 and/or the rear electrode 21 may be fabricated using the composition for solar cell electrodes according to embodiments. For example, the front electrode 23 may be fabricated using the composition including silver powder as the conductive powder, and the rear electrode 21 may be fabricated using the composition including aluminum powder as the conductive powder. The front electrode 23 may be formed by printing the composition for solar cell electrodes onto the emitter 12, followed by baking. The rear electrode 21 may be formed by applying the composition for solar cell electrodes onto the back surface of the semiconductor substrate 11, followed by baking.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1 to 5 and Comparative Examples 1 to 6

As an organic binder, 1.0 wt % of ethylcellulose (STD4, Dow Chemical Company) was sufficiently dissolved in 6.5 wt % of butyl carbitol at 60° C., and 89.0 wt % of spherical silver powder (AG-4-8, Dowa Hightech Co., Ltd.) having an average particle diameter of 1.0 μm, 3.0 wt % of a glass frit prepared according to the composition as listed in Table 1, 0.2 wt % of a dispersant BYK102 (BYK-chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

TABLE 1

|  | B | Fe | Mg | Na | Pb | Zn | Te | Bi | Li | Si | (Pb + Bi)/Zn | Te/Na |
|---|---|---|---|---|---|---|---|---|---|---|---|---|
| Example 1 | 35 | 1 | 2 | 10 | 10 | 2 | 30 | 8 | — | 2 | 9.0 | 3.0 |
| Example 2 | 25 | 1 | 2 | 5 | 15 | 5 | 25 | 15 | — | 7 | 6.0 | 5.0 |
| Example 3 | 30 | 1 | 2 | 7 | 15 | 2 | 30 | 10 | — | 3 | 12.5 | 4.3 |
| Example 4 | 30 | — | — | 5 | 10 | 3 | 30 | 17 | — | 5 | 9.0 | 6.0 |
| Example 5 | 35 | 1 | — | 6 | 15 | 3 | 25 | 15 | — | — | 10.0 | 4.2 |
| Comparative Example 1 | 10 | 1 | 3 | 14 | 10 | 13 | 30 | 2 | 7 | 10 | 0.9 | 2.1 |
| Comparative Example 2 | 5 | — | 2 | 10 | 17 | 2 | 30 | 24 | — | 10 | 20.5 | 3.0 |
| Comparative Example 3 | — | 2 | 2 | 14 | 15 | 5 | 12 | 15 | 15 | 20 | 6.0 | 0.9 |
| Comparative Example 4 | 25 | — | 2 | 2 | 15 | 3 | 33 | 15 | — | 5 | 10.0 | 16.5 |
| Comparative Example 5 | 30 | — | — | — | 10 | 3 | 30 | 17 | 5 | 5 | 9.0 | N/A |
| Comparative Example 6 | 30 | 1 | 2 | 5 | 10 | — | 30 | 17 | — | 5 | N/A | 6.0 |

(unit: mol %)

Measurement of Series Resistance (Rs), Open-Circuit Voltage (Voc), Fill Factor, and Efficiency Each of the compositions for solar cell electrodes prepared in Examples and Comparative Examples was deposited over a front surface of a wafer by screen printing in a predetermined pattern, followed by drying in an IR drying furnace. Then, an aluminum paste was printed on a back surface of the wafer and dried in the same manner. A cell formed according to this procedure was subjected to baking at a temperature of 400° C. to 900° C. for 30 seconds to 180 seconds in a belt-type baking furnace, thereby fabricating a solar cell. The solar cell was evaluated as to series resistance (Rs), open-circuit voltage (Voc), fill factor (FF, %), and conversion efficiency (Eff. %) using a solar cell efficiency tester (CT-801, Pasan Co., Ltd.), and results are shown in Table 2.

TABLE 2

| Item | Rs (mΩ) | Voc (V) | FF (%) | Eff. (%) |
|---|---|---|---|---|
| Example 1 | 1.89 | 0.6270 | 79.39 | 17.97 |
| Example 2 | 1.92 | 0.6275 | 79.38 | 17.98 |
| Example 3 | 1.90 | 0.6381 | 79.40 | 17.96 |
| Example 4 | 1.85 | 0.6274 | 79.47 | 17.96 |
| Example 5 | 1.92 | 0.6282 | 79.37 | 17.98 |
| Comparative Example 1 | 2.47 | 0.6273 | 78.83 | 17.80 |
| Comparative Example 2 | 2.01 | 0.6231 | 79.10 | 17.85 |
| Comparative Example 3 | 2.05 | 0.6225 | 78.90 | 17.83 |
| Comparative Example 4 | 2.30 | 0.6261 | 78.90 | 17.83 |
| Comparative Example 5 | 2.10 | 0.6242 | 78.91 | 17.85 |
| Comparative Example 6 | 2.40 | 0.6275 | 78.89 | 17.86 |

As shown in Table 2, it can be seen that the electrodes prepared from the compositions of Examples 1 to 5 in which the molar ratio of the sum of lead and bismuth to zinc and the molar ratio of tellurium to sodium satisfy the ranges specified herein had excellent series resistance and open-circuit voltage while exhibiting excellent fill factor and conversion efficiency.

Conversely, the electrodes prepared from the compositions of Comparative Examples 1 to 2 in which the molar ratio of the sum of lead and bismuth to zinc was outside the range specified herein had an increased series resistance and thus a low fill factor and conversion efficiency. In addition, the electrodes prepared from the compositions of Comparative Examples 3 to 4 in which the molar ratio of tellurium to sodium was outside the range specified herein had a low open-circuit voltage and thus a low fill factor and conversion efficiency. Further, the electrode prepared from the composition of Comparative Example 5 not including sodium and the electrode prepared from the composition of Comparative Example 6 not including zinc had a low series resistance and thus a low fill factor and conversion efficiency.

By way of summation and review, as a composition for solar cell electrodes, a conductive paste composition including a conductive powder, a glass frit, and an organic vehicle may be used. The glass frit dissolves an antireflection film formed on a semiconductor wafer such that the conductive powder can be brought into electrical contact with the semiconductor substrate. Generally, as the glass frit, lead-containing glass has been mainly used. A lead-containing glass allows easy control of the softening point and has excellent adhesion with a semiconductor substrate. However, a lead-containing glass frit may have a high contact resistance with the substrate, causing poor solar cell efficiency. In order to address this issue, compositions for solar cell electrodes using a tellurium-containing glass frit capable of obtaining low contact resistance have been proposed. However, compositions using a tellurium-containing glass frit may have poor properties in terms of open-circuit voltage (Voc) and series resistance (Rs) and thus have limitations in improving conversion efficiency.

Therefore, a composition for solar cell electrodes that has excellent properties in terms of open-circuit voltage (Voc) and series resistance (Rs) is desirable. Embodiments may provide a composition for solar cell electrodes that has excellent properties in terms of open circuit voltage and series resistance.

Embodiments further provide a solar cell electrode that is fabricated using the composition for solar cell electrodes and which may have excellent conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A composition for solar cell electrodes, the composition comprising:
    a conductive powder,
    a glass frit, and
    an organic vehicle,
    wherein the glass frit contains tellurium (Te), sodium (Na), zinc (Zn), lead (Pb), and bismuth (Bi), and
    a molar ratio of the sum of lead and bismuth to zinc ranges from about 5 to about 20, and a molar ratio of tellurium to sodium ranges from about 1 to about 15.

2. The composition for solar cell electrodes as claimed in claim 1, wherein the molar ratio of the sum of lead and bismuth to zinc ranges from about 5 to about 15.

3. The composition for solar cell electrodes according as claimed in claim 1, wherein the molar ratio of tellurium to sodium ranges from about 1 to about 10.

4. The composition for solar cell electrodes as claimed in claim 1, wherein the glass frit includes about 25 mol % to about 40 mol % of the sum of lead and bismuth, about 10 mol % to about 45 mol % of tellurium, about 1 mol % to about 20 mol % of sodium, and about 2 mol % to about 5 mol % of zinc.

5. The composition for solar cell electrodes as claimed in claim 1, wherein the glass frit further includes at least one of aluminum, calcium, boron, copper, iron, potassium, magnesium, and silicon.

6. The composition for solar cell electrodes as claimed in claim 1, including:
    about 60 wt % to about 95 wt % of the conductive powder;
    about 0.1 wt % to about 20 wt % of the glass frit; and
    about 1 wt % to about 30 wt % of the organic vehicle.

7. The composition for solar cell electrodes as claimed in claim 1, further comprising at least one additive selected from a dispersant, a thixotropic agent, a plasticizer, a viscosity stabilizer, an anti-foaming agent, a pigment, a UV stabilizer, an antioxidants, and a coupling agents.

8. A solar cell electrode fabricated using the composition for solar cell electrodes according to claim 1.

9. A solar cell electrode fabricated using the composition for solar cell electrodes according to claim 2.

10. A solar cell electrode fabricated using the composition for solar cell electrodes according to claim 3.

11. A solar cell electrode fabricated using the composition for solar cell electrodes according to claim 4.

12. A solar cell electrode fabricated using the composition for solar cell electrodes according to claim 5.

13. A solar cell electrode fabricated using the composition for solar cell electrodes according to claim 6.

14. A solar cell electrode fabricated using the composition for solar cell electrodes according to claim 7.

* * * * *